(12) United States Patent
Foo et al.

(10) Patent No.: US 6,493,569 B2
(45) Date of Patent: Dec. 10, 2002

(54) METHOD AND APPARATUS USING POST CONTRAST-ENHANCED STEADY-STATE FREE PRECESSION IN MR IMAGING

(75) Inventors: Thomas K. F. Foo, Rockville, MD (US); Vincent B. Ho, North Bethesda, MD (US)

(73) Assignees: GE Medical Systems Global Technology Company, LLC, Grant, FL (US); Uniformed Services University of Health Sciences, Bethesda, MD (US)

( * ) Notice: Subject to any disclaimer, the term of this patent is extended or adjusted under 35 U.S.C. 154(b) by 128 days.

(21) Appl. No.: 09/681,090

(22) Filed: Dec. 30, 2000

(65) Prior Publication Data

US 2002/0087070 A1 Jul. 4, 2002

(51) Int. Cl.[7] .................................. A61B 5/05
(52) U.S. Cl. .................... 600/410; 600/419; 600/420; 382/128; 382/130; 382/154; 382/254; 324/307; 324/309; 324/310
(58) Field of Search ................ 600/407, 410, 600/419, 420; 382/128, 130, 131, 154, 173, 254, 260; 324/300, 307, 309, 310

(56) References Cited

U.S. PATENT DOCUMENTS

| | | | |
|---|---|---|---|
| 4,973,906 A | * 11/1990 | Bernstein | 324/306 |
| 5,034,692 A | * 7/1991 | Laub et al. | 324/309 |
| 5,170,122 A | * 12/1992 | Bernstein | 324/306 |
| 5,256,967 A | * 10/1993 | Foo et al. | 324/309 |
| 5,349,295 A | * 9/1994 | Tokunaga | 324/309 |
| 5,437,216 A | * 8/1995 | Chapman | 137/596 |
| 6,366,090 B1 | * 4/2002 | Heid | 324/307 |

OTHER PUBLICATIONS

Zur Y, Wood ML, Neuringer LJ. Motion insensitive SSFP imaging. Magn Reson Med. 1990; 16: 444–59.

* cited by examiner

Primary Examiner—Marvin M. Lateef
Assistant Examiner—Jeoyuh Lin
(74) Attorney, Agent, or Firm—Timothy J. Ziolkowski; Michael A. Della Penna; Carl B. Horton

(57) ABSTRACT

A system and method are disclosed that use the steady-state free precessing (SSFP) technique for MR imaging to allow the acquisition of MR angiography images in which the acquisition is not time dependent upon the first passage of a contrast agent. The technique includes applying a pulse sequence with refocusing S⁻ signals from a train of RF pulses to a desired field-of-view (FOV) in a patient in which a contrast bolus has been injected. An SSFP image of the desired FOV is acquired, together with an S⁻ SSFP mask image of the desired FOV. The S⁻ SSFP mask image is subtracted from the SSFP image in order to reconstruct an image with improved visualization of the arterial and venous structures and reduce mis-registration artifacts.

32 Claims, 7 Drawing Sheets

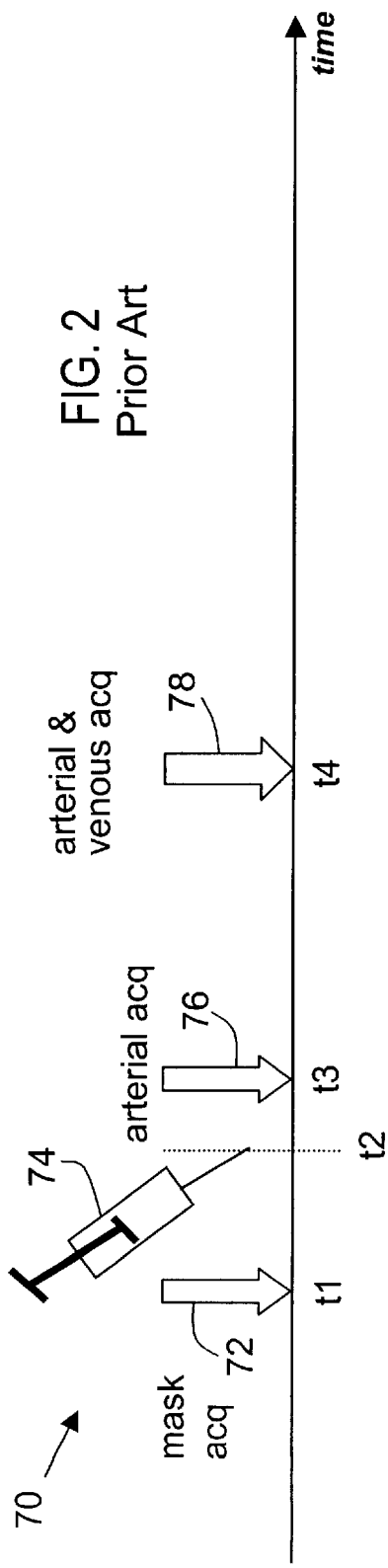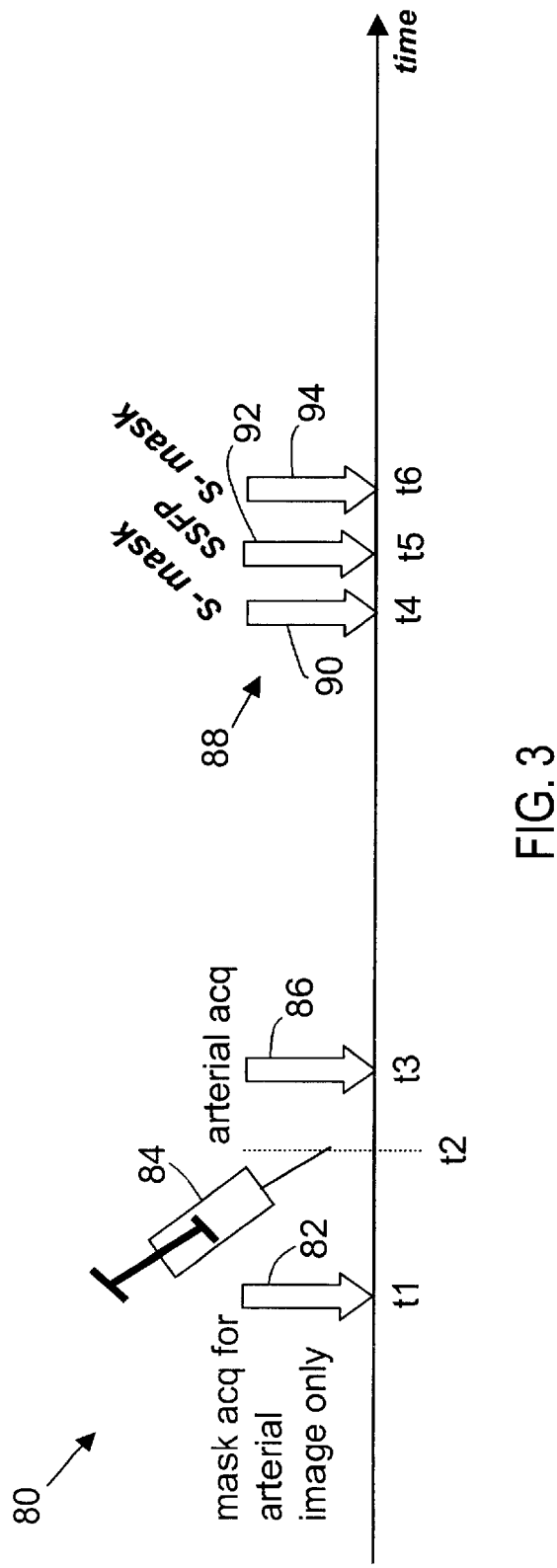

METHOD AND APPARATUS USING POST CONTRAST-ENHANCED STEADY-STATE FREE PRECESSION IN MR IMAGING

BACKGROUND OF INVENTION

The present invention relates generally to an improved method for acquiring magnetic resonance images (MRI) of blood-carrying vessels, and more particularly to, a method and apparatus to acquire post-contrast images to visualize arterial and venous structures that is not time dependent on the acquisition of the images during the arterial or immediate post-injection period of a contrast bolus and uses steady-state free precession (SSFP) pulse sequences.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_y$. A signal is emitted by the excited spins after the excitation signal $B_1$ is terminated and this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques. Magnetic resonance angiography (MRA) is an emerging technology for the non-invasive assessment of arterial and venous structures. Intravenously administered contrast agents increase the visualization of these structures for contrast-enhanced MRA, especially if performed during their initial passage (a.k.a. first pass or arterial phase) in the target vessel. The imaging of small vessels with contrast-enhanced MRA techniques however requires a compromise of image spatial resolution and imaging time. In general, higher spatial resolution requires extended imaging time. Extended imaging time, however, diminishes the ability to achieve high arterial signal-to-noise (S/N) since bolus duration must be extended to match the elongated imaging time. This is problematic since a slower bolus administration results in lower achieved concentrations of contrast media. In addition, by prolonging the acquisition period, the signal intensity of the venous structures is increased due to venous re-circulation. Therefore, extending or prolonging data acquisition after the initial contrast passage will lead to not only diminished arterial signal intensity but also increased venous signal intensity, the result of which is compromised ability to visualize diseased vessels.

In order to improve vascular depiction, background suppression is usually employed. Background suppression for MRA is obtained by either applying fat suppression pulses during the first pass acquisition, or subtracting out the background signals using a pre-contrast mask. The pre-contrast mask image has identical acquisition parameters as the first pass acquisition. Signal intensity for all structures in the pre-contrast mask image is identical to that of the first pass acquisition, except for the vascular structures. Subtracting the pre-contrast mask from the first pass image then yields only signal from vascular structures. This is particularly important in imaging the small vessels such as may exist in the calf region in a patient because of the amount of fat and soft tissue background which often obscures adequate visualization of the small vessels. However, there are problems with both techniques. For example, applying fat suppression pulses is dependent on good magnetic field homogeneity and tends to increase the overall scan time. This increased scan time also increases the possibility of venous signal contamination and suboptimal arterial signal. The technique of using a mask subtraction requires that the patient not move significantly between the mask acquisition and the contrast-enhanced acquisition. Failure to do so will cause mis-registration artifacts in the reconstructed image, thereby resulting in inadequate background suppression and artifacts from the subtraction of mis-registered objects.

Coherent steady-state free precession (SSFP) is a technique in which the free induction decay (FID) signal (i.e., $S^+$ signal) and the spin echo signal ($S^-$ signal) from a train of RF pulses are refocused within each repetition time (TR) interval. The zeroth gradient moments accumulate to zero at the end of each TR interval. This results in the same amount of transverse and longitudinal magnetization being generated after each radio frequency (rf) pulse and increases the available image signal-to-noise ratio (S/N). However, use of this contrast acquisition technique results in high signal intensities from fat which do not decrease significantly with increasing flip angles. Furthermore, as the tissue contrast is a function of the ratio of the spin-spin relaxation time ($T_2$) and the spin-lattice relaxation time ($T_1$) high signal intensity is also returned from fluid. Subsequently, high signal intensity is obtained from the internal abdominal organs. This significant drawback has prevented coherent SSFP acquisition from being used with first pass MRA since there is but one chance to acquire a good image. Furthermore, coherent SSFP acquisition results in high signal intensities from water as well. Therefore, the signal from the small bowel, bladder, etc., remains high in both the post and pre-contrast SSFP images which diminish its application for imaging vessels in the abdomen and pelvis. Since the motion from these structures cannot be predicted and is fairly random, subtraction cannot effectively suppress signals from these structures.

On the other hand, coherent SSFP images have higher image S/N than conventional gradient echo images as used for conventional contrast-enhanced MRA. These S/N improvements of SSFP can also improve visualization of vessels having slow or disrupted flow as seen in areas of stenosis or intimal pathology circumstances which often result in the over-estimation of disease using conventional contrast-enhanced MRA methods. It would therefore be desirable to have a technique, or a series of techniques, to maximize the use of SSFP for MRA applications that do not require the use of a pre-contrast mask image, and is therefore not as sensitive to the time relative to the administration of a contrast bolus, nor spatially limited by the same temporal considerations of bolus kinetics.

SUMMARY OF INVENTION

The present invention relates to a system and method for acquiring MR images using SSFP pulse sequences to produce images with high background suppression and significant contrast, such as between vessels and adjacent soft tissue, such as fat, muscle, bone marrow, fluid, and such, that solves the aforementioned problems.

Since it is known that the coherent SSFP technique results in an acquisition with high signal intensity for blood, water, and fat, the present invention takes advantage of this result by repeating such an acquisition with an additional S⁻ SSFP acquisition in which structures with moving blood have relatively low signal intensity. The S⁻ SSFP acquisition is an incoherent steady-state technique that acquires signal only from the FID that is refocused by the subsequent rf pulse. Thus, tissue contrast is a function of $T_2$ and it has similar signal intensity characteristics as the coherent SSFP signal. The exception is that by spoiling the FID, the refocused echo is highly sensitive to flow related dephasing, leading to dark signal in vascular structures. By subtracting the S⁻ SSFP image from the SSFP image, a high image S/N of preferentially arterial and venous structures can be obtained. This is possible even where both images are acquired a considerable amount of time after the first pass of the contrast agent. In addition, the image S/N of the arterial and venous signal is much higher than that encountered using conventional gradient echo techniques performed at the same delayed time following the administration of contrast media.

Further, since the signal from vascular structures is relatively low with black-blood image contrast in the S⁻ SSFP images, better background suppression can be realized if a scaling factor, or weighting, is applied to the S⁻ SSFP image to improve vessel conspicuity. This technique is particularly useful for screening of vascular pathology, especially venous vascular disease, such as lower extremity deep venous thrombosis that can occur over an extensive anatomic region that spans from the calf through the inferior vena cava, right ventricle and into the pulmonary arteries.

There are a number of advantages to using such a technique. For one, the image S/N is higher than that of conventional gradient echo images. Another is that since the mask and the SSFP image can be acquired back-to-back, the patient is required to remain still for only a very short time, which significantly reduces the occurrence of spatial mis-registration artifacts. Further, the ability to obtain MRA images well after the first pass of the contrast agents allows improved visualization of the arterial and venous structures with higher spatial resolution. Such delayed imaging also provides a reliable backup sequence in case the primary angiographic sequence fails.

In accordance with one aspect of the invention, an MR imaging technique includes injecting a contrast bolus into a patient, and then applying a pulse sequence with refocusing S⁻ signals from a train of RF pulses to a desired FOV in the patient at a time that is independent of when the contrast bolus was injected.

The technique includes acquiring both an S⁻ SSFP mask image and an SSFP image, and then subtracting the S⁻ mask image from the SSFP image. The mask image can be acquired either before or after the primary SSFP image is acquired, or alternatively, a mask image can be acquired both before and after the primary SSFP image in order to minimize the effects of patient motion. In the latter case, either the system or an operator can select the better mask image to use in the subtraction part of the imaging process. An optional scale factor can be applied to the mask image to further improve background tissue suppression. A hybrid approach is also disclosed in which a gradient echo pulse sequence is applied according to conventionally known first-pass MRI techniques to visualize the larger arterial vessels, and then an SSFP sequence is applied to visualize the smaller vessels.

In accordance with another aspect of the invention, an MRI apparatus to acquire MR angiography (MRA) images includes a magnetic resonance imaging system having an RF transceiver system and a plurality of gradient coils positioned about the bore of a magnet to impress a polarizing magnetic field. An RF switch is controlled by a pulse module to transmit RF signals to an RF coil assembly for acquiring MR images. A computer is programmed to acquire the SSFP and the S⁻ SSFP images. It is noted that either image can be acquired first, and preferably, the images are acquired with minimal time separation therebetween to reduce spatial mis-registration artifacts secondary to patient motion. The computer then subtracts the S⁻ mask image from the SSFP image and reconstructs an image from the subtracted images having a high contrast and significant background suppression. This technique is equally applicable to both 2D images and 3D volume acquisitions.

Yet another aspect of the invention includes a computer program having a set of instructions which, when executed by a computer, cause the computer to apply an SSFP pulse sequence and acquire an SSFP image, and apply an S⁻ SSFP pulse sequence and acquire an S⁻ SSFP image. The S⁻ SSFP is then subtracted from the SSFP image and an image is reconstructed with high background suppression and significant contrast between vessels and the background, such as fat, muscle, bone marrow, fluid and other soft tissue.

This technique allows the imaging of arterial and venous structures in a delayed period, or "quasi-steady-state" following the administration of a contrast media. Unlike conventional MR techniques, the mask image can be acquired at any time, and is not dependent on the time of administration of the contrast media. This technique can also be combined with conventional first-pass MRA that uses a gradient echo pulse sequence to image large vessels while the SSFP sequence can be used to visualize the smaller or more distal vessels.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention. In the drawings:

FIG. 2 is a timing diagram illustrative of a prior art MRA acquisition.

FIG. 3 is a timing diagram illustrative of an MRA acquisition in accordance with the present invention.

DETAILED DESCRIPTION

Figure 1:
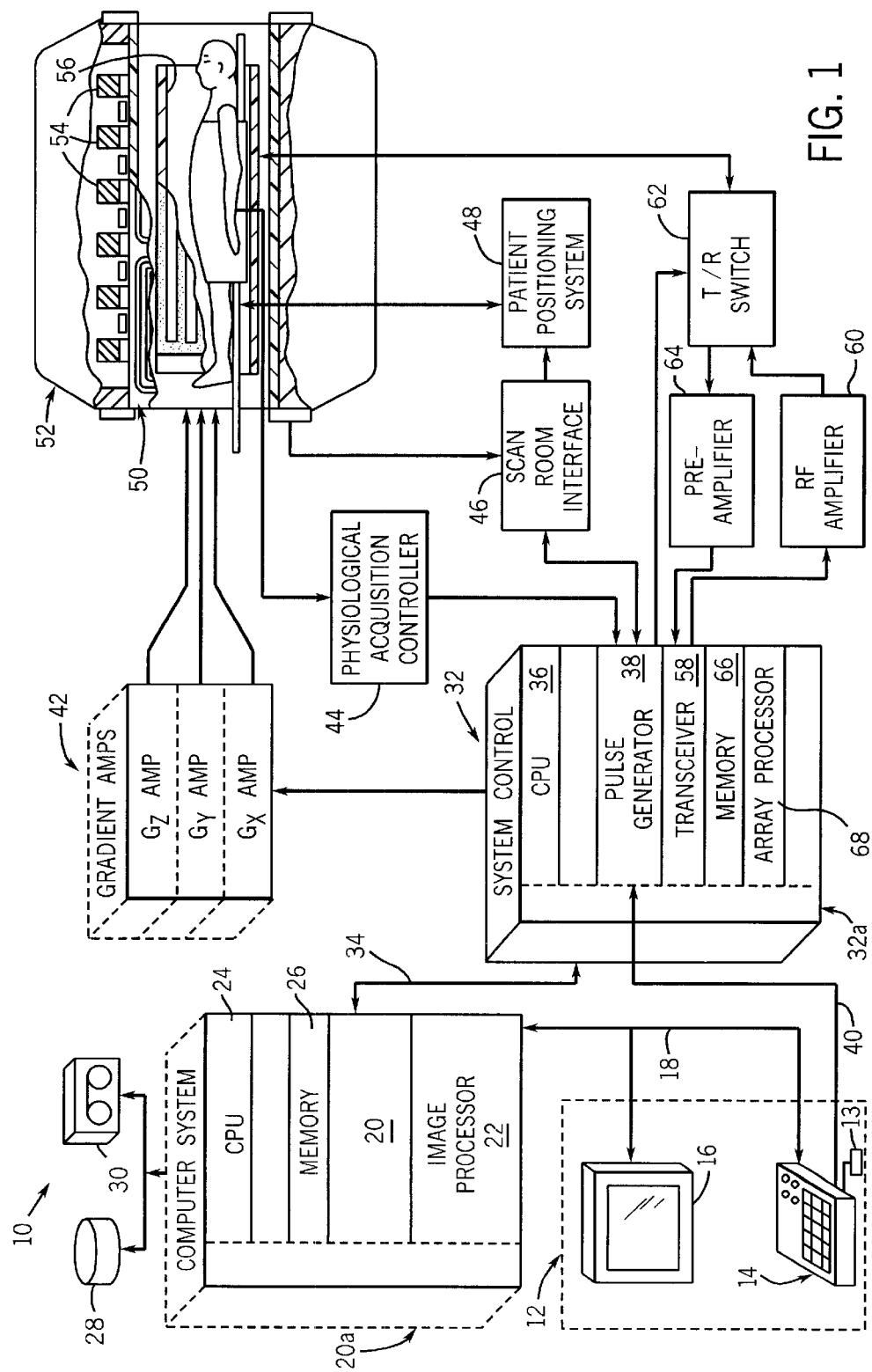
FIG. 1 is a schematic block diagram of an NMR imaging system for use with the present invention.

Referring to FIG. 1, the major components of a preferred MRI system 10 incorporating the present invention are shown. The operation of the system is controlled from an operator console 12 which includes a keyboard or other input device 13, a control panel 14, and a display 16. The console 12 communicates through a link 18 with a separate computer system 20 that enables an operator to control the production and display of images on the screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to a disk storage 28 and a tape drive 30 for storage of image data and programs, and it communicates with a separate system control 32 through a high speed serial link 34. The input device 13 can include a mouse, joystick, keyboard, track ball, touch screen, light wand, voice control, or similar device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator which indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in an assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil S6 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface coil) to be used in either the transmit or receive mode.

The MR signals picked up by the RF coil 56 are digitized by the transceiver module 58 and transferred to a memory module 66 in the system control 32. When a scan is completed, an array of raw k-space data has been acquired in the memory module 66. As will be described in more detail below, this raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

The present invention includes a method and system suitable for use with the above-referenced MR system, or any similar or equivalent system for obtaining MR images. The invention takes advantage of the coherent steady-state free precession (SSFP) MR data acquisition in a manner that increases the signal-to-noise ratio (S/N) that is particularly useful in angiography (MRA). It is commonly regarded by those skilled in the art that SSFP acquisition implies a coherent SSFP acquisition where all signals (FID, refocused echoes) are refocused or maintained in coherence in each TR interval. This is in contrast to incoherent SSFP techniques such as gradient recalled echoes that refocus the FID or $S^+$ signal while crushing or dephasing the refocused FID or $S^-$ signal. Conversely, generation of the $S^-$ signal requires that the primary $S^+$ signal be crushed or dephased. Due to the need to crush or ensure that one component of the steady-state free precession (SSFP) signal is incoherent, $S^+$ and $S^-$ signal generation is considered as a subclass of SSFP techniques commonly referred to as incoherent SSFP techniques.

Referring to FIG. 2, a conventional MRA acquisition technique 70 includes the acquisition of a pre-contrast mask image 72 at time t1, followed by the administration of a contrast bolus 74 at time t2. Arterial-only data 76 are acquired at time t3, which is a time where the contrast bolus has, or is, passing through the arteries of a patient, but not yet reached the venous vessels. As is known, the administration of a contrast agent increases the image S/N ratio in the arterial vessels during the first passage of the contrast material to enhance the MRA screening technique. Accordingly, the time period between the arterial acquisition 76 and the injection of the contrast agent 74 (i.e., t3–t2) is critical in this conventional MRA acquisition. Data for a third MR image 78 is then acquired at time t4 which includes the entire arterial and venous structure after the contrast agent has been evenly distributed throughout the vessel structure. The arterial acquisition 76 can then be subtracted from the arterial and venous acquisition 78 to acquire a venous only image. Similarly, a mask image, that results from the pre-contrast mask acquisition 72, can be subtracted from both the arterial image and the arterial and venous image to remove background structure. While this MRA technique works well, there are some drawbacks. For example, in order to avoid image mis-registration, very little motion is tolerable during this technique. That is, from time t1 to time t4, the patient is required to remain very still, and any movement between the acquisitions 72, 76, and/or 78, can result in the entire procedure having to be repeated. However, since the procedure requires a contrast agent, substantial time is lost in waiting to clear the contrast agent from the patient's system. Further, complicating this procedure is the fact that some contrast agents cannot be re-administered for extended periods.

FIG. 3 shows an MRA acquisition 80 that significantly improves the screening of arterial and venous vascular disease by providing an image of the arterial and venous signal with a much higher S/N ratio than that encountered using the conventional gradient echo technique described with reference to FIG. 2. The technique of FIG. 3 includes the acquisition of a pre-contrast mask image 82 at time t1 that is used only for arterial image reconstruction, followed by the administration of a contrast agent bolus 84 at time t2. Similar to the arterial acquisition 76 in the conventional MRA acquisition 70, of FIG. 2, data is acquired 86 at t3 to view the arterial structure during the first pass of the contrast agent 84. However, the acquisition of the arterial and venous data 88 can occur at any time after acquisition of the arterial-only acquisition 86. In other words, the arterial and venous acquisition 88 is not dependent in time or in space from the previous acquisitions because a separate mask image is acquired.

As will be further described with reference to FIGS. 4 and 5, the present invention uses a technique known as incoherent steady-state free precession (SSFP) in which the spin echo, or S$^-$ signal, from a train of RF pulses is refocused. This S$^-$ pulse sequence is used to generate an S$^-$ mask 90 at time t4, followed by a standard SSFP acquisition 92 at time t5. Although acquisitions 90 and 92 are sufficient to reconstruct an arterial and venous image in this particular embodiment, a second S$^-$ mask 94 is acquired at time t6. When more than one S$^-$ mask image is acquired, the one that minimizes mis-registration artifacts the best is selected to be subtracted from the SSFP acquisition 92. It is also noted that the SSFP acquisition 92 can occur before the first S$^-$ mask acquisition 90. Therefore, the arterial and venous acquisition 88 can include the S$^-$ mask 90 and SSFP acquisition 92; or the SSFP acquisition 92 and the S$^-$ mask acquisition 94; or the S$^-$ mask acquisition 90, the SSFP acquisition 92, and the S$^-$ mask acquisition 94. As one skilled in the art will recognize, the acquisitions 90, 92, and/or 94, preferably occur with minimal time separation between t4, t5, and/or t6, thereby minimizing the time the patient must remain still. In addition, the acquisitions 90, 92, and/or 94 can occur in any permutation and combination just as long as they occur with minimal time separation between each other. Further, the arterial and venous acquisition 88 can occur at any time after acquisition of the arterial—only image 86 at t3, and it is therefore not time dependent on time points t1, t2 and/or t3.

Figure 4:
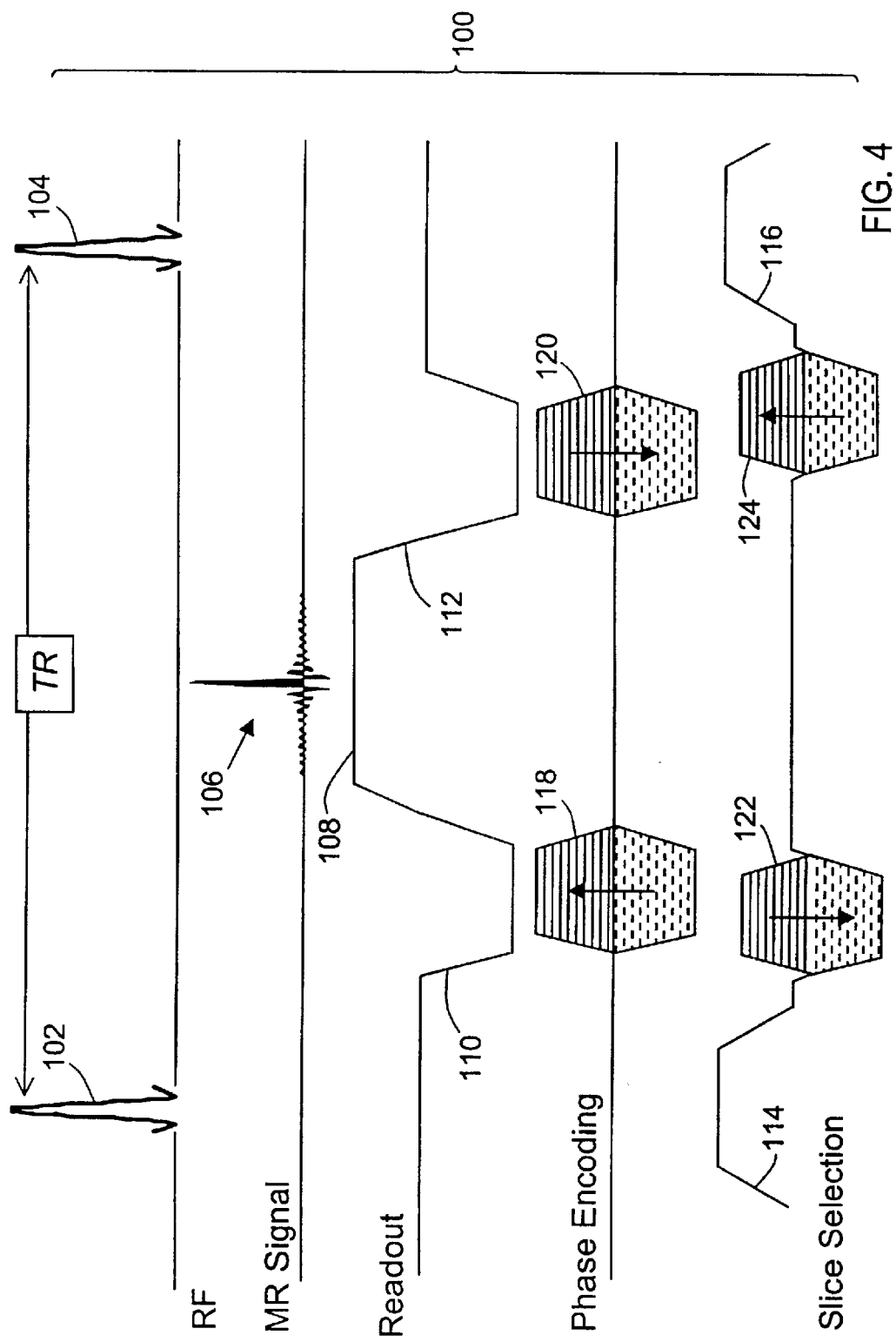
FIG. 4 is a timing diagram of an MR imaging pulse sequence used in the MRA acquisition of FIG. 3.
Figure 5:
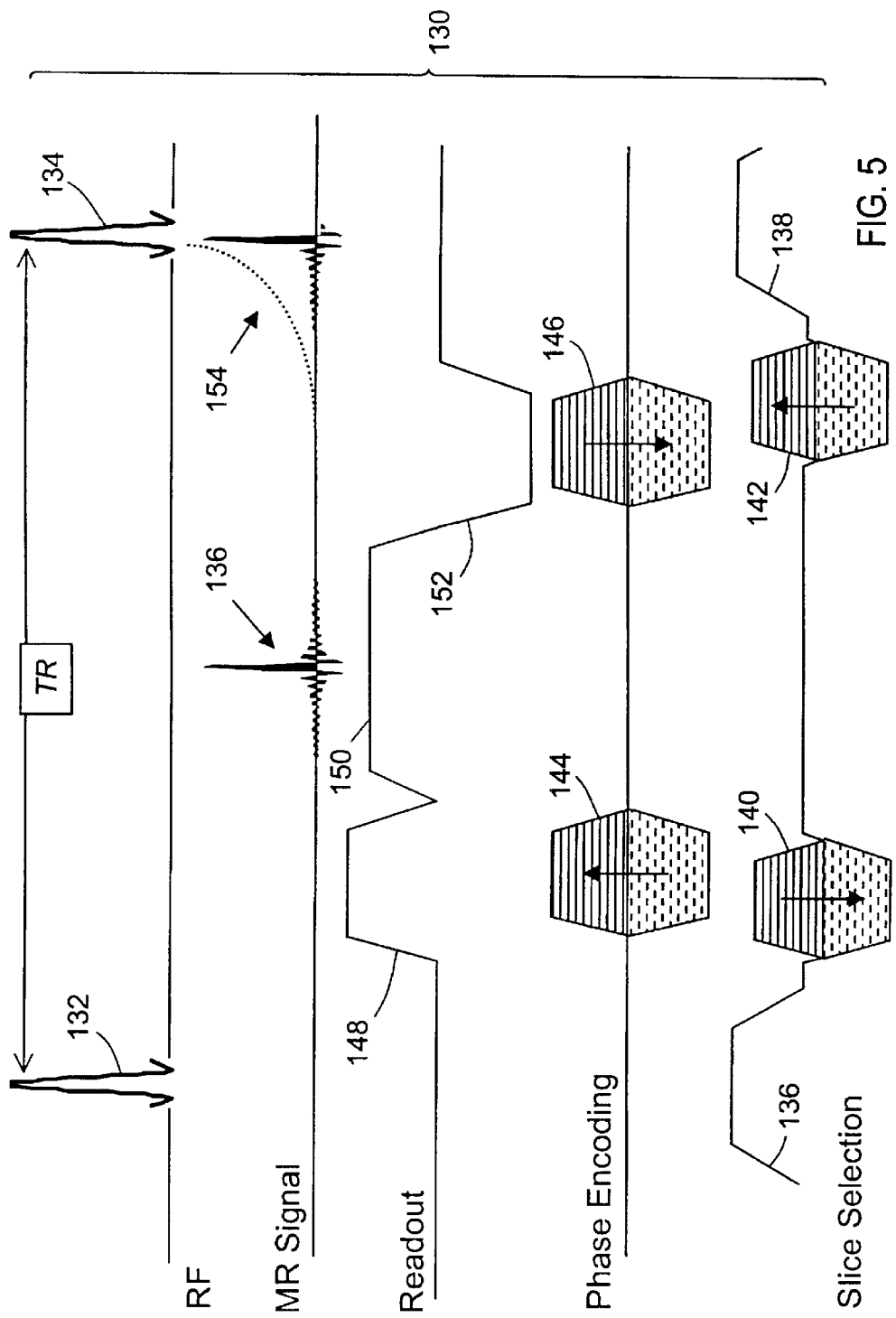
FIG. 5 is a timing diagram of another MR imaging pulse sequence used in the MRA acquisition of FIG. 3.

FIG. 4 shows a pulse sequence 100 used for the SSFP acquisition to generate the SSFP image. The pulse sequence 100 has a repetition time TR from one RF pulse 102 to the next 104. In this SSFP image acquisition technique, MR data is acquired during MR data acquisition 106 which is coincident with the positive readout gradient 108. Negative readout gradients 110, 112, are positioned on either side of the positive readout gradient 108 such that the free induction decay (FID), or the S$^+$ signal, and the spin echo, or S$^-$ signal, from the train of RF pulses 102, 104 are refocused. It is noted that in the acquisition of the SSFP image, the summation of the area under the positive and negative readout gradients is zero, which is a necessary condition to generate a coherent SSFP signal and is true for all gradient axes. The RF pulses 102, 104 are each coincident with a slice selection gradient 114, 116. A slice encoding gradient 122 follows each slice selection gradient 114, 116, and a rephasing slice encoding gradient 124 precedes each pulse encoding gradient 114, 116. Note that the slice encoding gradient 122 and the rephasing slice encoding gradient 124 also includes the necessary gradient area to compensate for the slice selection gradient areas of 114 and 116 such that the net area (zeroth gradient moment) in each TR interval is zero. The same is true of the phase encoding gradient 118 and the rephasing phase encoding gradient 120. The net gradient area along the phase encoding axis is also zero in each TR interval. The image reconstructed with this SSFP data acquisition shows soft tissue, such as blood, water, and fat, with high signal intensity.

Where FIG. 4 shows the pulse sequence to acquire data for the SSFP image, FIG. 5 shows a pulse sequence 130 to acquire the data for an S$^-$ SSFP mask image. With the repetition time TR defined by the position of RF pulses 132 and 134, MR data is acquired during MR acquisition period 136, which includes only S$^-$ signals since the signal from the FID is crushed or dephased by a positive gradient lobe 148, in contrast with the pulse sequence 100 of FIG. 4. While the slice selection gradients 136, 138, together with the slice encoding gradients 140, 142, and the phase encoding gradients 144, 146 are all positioned similarly to that of FIG. 4, the readout gradients are markedly different. That is, to acquire the S$^-$ signals, a first, positive readout gradient 148 is applied to dephase the FID or S$^+$ signal coming off the rf pulse 132. An echo from the S$^-$ signal (that normally forms just prior to the rf pulse 134) is dephased by a negative gradient lobe 152, leading to the echo 136 reforming during the readout gradient 150. The rf pulse 134 acts as a refocusing rf pulse that forms an S$^-$ signal in the next TR interval from the crushed FID from rf pulse 132. Preferably, the negative read-out 152 is of equal area as the first, positive read-out gradient 148, with the area of each equal to half that of the read-out gradient 150. Since there are two positive readout gradients, and one negative readout gradient, and the summation of the areas do not cancel, the S$^-$ signal is preserved and can be acquired. The S$^-$ signal, or the spin echo, is represented by arc 154 at the end of an RF period. Note that this is where an S$^-$ signal would normally form in the absence of any external applied gradients. The gradient lobe 152 then moves the S$^-$ signal echo to form within the TR interval rather than at the end of the TR interval. The S$^-$ SSFP acquisition results in an image with structures from moving blood having low signal intensity due to flow-related dephasing. Since the SSFP acquisition results in high signal intensity for blood, water, and fat, by subtracting the S$^-$ SSFP image from the SSFP image, an image with a high S/N ratio of the arterial and venous structures is obtained. The image S/N of the venous signal is much higher than that encounter using conventional gradient echo techniques. These images have enormous potential for the screening of venous vascular disease, such as deep venous thrombosis.

Since the signal from the vascular structures is low with black-blood image contrast in the S$^-$ SSFP images, better background suppression can be realized if a scaling factor is applied to the S$^-$ SSFP images. Further, reconstructing a maximum intensity projection (MIP) image from a 3-D volume acquisition, provides an image that has much greater venous visualization than previously achieved. The subtraction is preferably accomplished according to: Subtracted_ MRA=SSFP−α (S$^-$ SSFP)(Eqn. 1) where α is the scale or weighting factor to affect better cancellation of the background stationary tissue. The weighting factor is determined by trial and error. Increasing the value of α leads to better background tissue subtraction. However, a larger value of α also leads to increased noise in the subtracted image as the α value also amplifies the noise in the mask images. The range of weighting factors believed to produce the most practically useful images is from 1.0–1.5.

Figure 6:
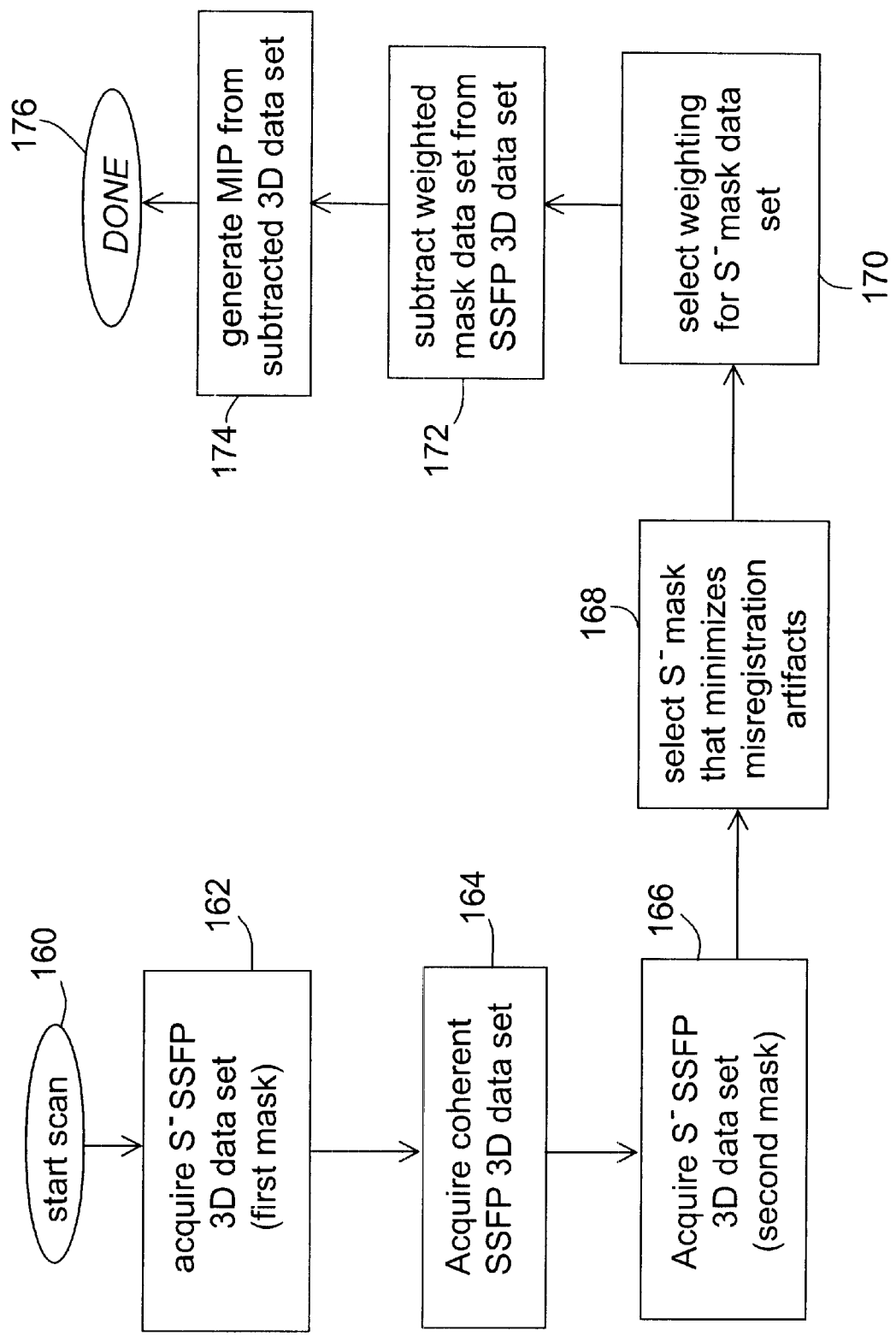
FIG. 6 is a flow chart illustrating a preferred embodiment of a technique employed in the present invention.

FIG. 6 shows a flow chart depicting a preferred technique in acquiring MR images. At the start of such a scan 160, a pulse sequence with refocusing S$^-$ signals from a train of RF pulses is applied to a desired field-of-view (FOV) in a patient after a contrast bolus has been injected into the patient. An S$^-$ SSFP mask image is acquired of the desired FOV 162, and in one embodiment, is indicated as a first mask image. The process next includes acquiring a coherent SSFP 3-D data set to reconstruct an SSFP image 164. After the acquisition of the data set for the SSFP image, an optional second mask can be acquired 166. That is, a second S⁻ SSFP 3-D data set can be acquired, and the technique then selects which of the S⁻ mask images would best minimize mis-registration artifacts 168. After selecting the weighting for the selected mask 170, the weighted mask data set is subtracted from the SSFP data set 172. A maximum intensity projection (MIP) image can then be generated from the subtracted data set 174 to complete the MRA acquisition at 176.

Referring back to FIG. 3, the technique includes acquiring a mask image for arterial-only image reconstruction at the onset, before injecting the contrast bolus, and then acquiring an arterial-only image during first pass of the contrast bolus. The arterial-only mask image can then be subtracted from the arterial-only image. In this manner, the subtracted arterial image can be used to visualize the arterial structure, and the subtracted SSFP image can be used to best visualize the venous structure. In this respect, this hybrid approach combines first pass MRA using a conventional gradient echo pulse sequence to visualize the aorto-illiac region, with the SSFP sequence to visualize the more distal vessels. However, this technique is applicable to generating high spatial resolution images of any anatomical region. The technique described is a general purpose acquisition technique that allows the high spatial resolution visualization of both arterial and venous structures. This can be used for a later inspection of a region of suspected arterial stenosis or to screen for and locate regions of venous thrombosis, especially in the more distal peripheral vasculature.

Figure 7:
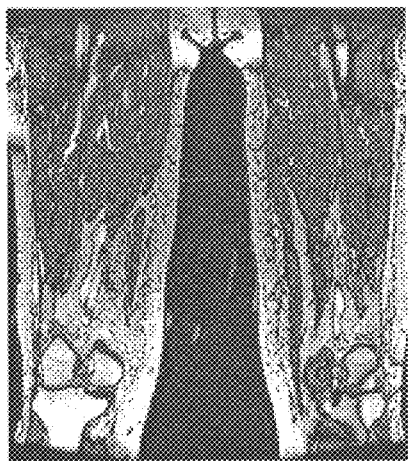
FIGS. 7–11 are images of subjects using various image acquisition techniques.
Figure 8:
Figure 9:
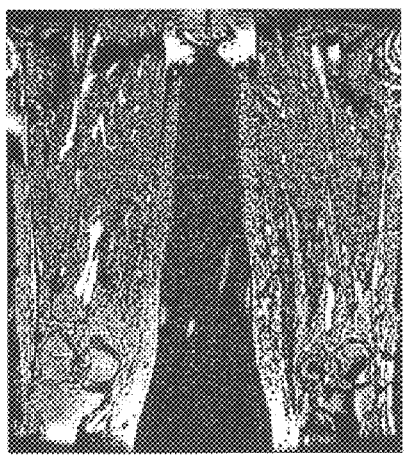
Figure 10:
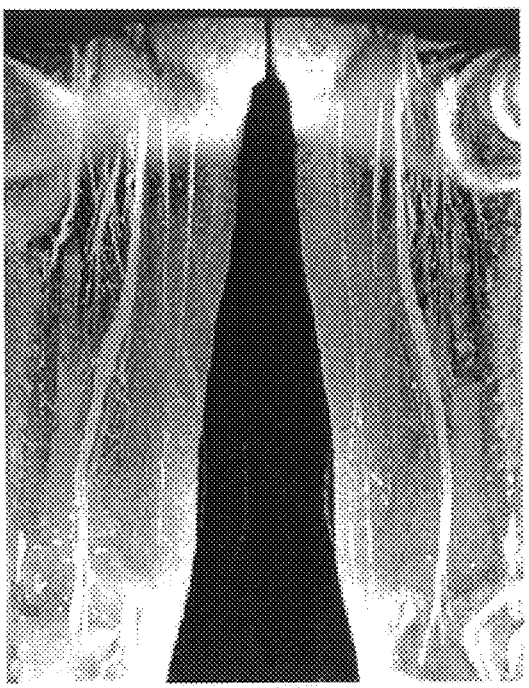
Figure 11:

Referring now to FIGS. 7–11, a number of images are shown of the same subject with the differing image techniques described. FIG. 7 shows an SSFP image reconstructed with the SSFP acquisition of FIG. 4. As indicated in this SSFP image, the muscle appears darkened and fat and bone appear with very high intensity, however, the blood vessels and particularly, the vascular structure, although bright, are not well defined due to the underlying high signal intensity from sub-cutaneous fat and bone marrow. FIG. 8 shows an S⁻ SSFP image in which the vessel signals are markedly reduced while fat and bone marrow still remain relatively bright. FIG. 9 shows an image after weighted subtraction, with weighting of α=1.2. As indicated, the fat is substantially reduced and there is substantially improved contrast between the vessels against a very dark background. Where FIG. 9 is an image of one slice from a 3D volume acquisition, FIGS. 10 and 11 show a series of SSFP images after being processed using maximum intensity projection (MIP) with 3-D volume acquisitions. FIG. 10 shows a MIP from just the SSFP 3-D data set. The soft tissue still appears too bright and obscures adequate visualization of the arterial and venous structures. FIG. 11 shows a MIP image that was reconstructed after first subtracting the S⁻ SSFP data set from the SSFP 3-D data set. FIG. 11 shows a marked improvement in both arterial and venous structure visualization.

Accordingly, the invention includes an MR imaging technique that includes injecting a contrast media bolus into a patient, and then sometime later, applying a pulse sequence with refocusing S⁻ signals from a train of RF pulses to a desired FOV in the patient. The technique includes acquiring an S⁻ SSFP mask image and an SSFP image of the desired FOV. Either can be acquired first, and by acquiring one right after the other, image mis-registration can be avoided. The technique includes subtracting the S⁻ mask image from the SSFP image.

Preferably, the technique includes applying a scale factor to the S⁻ mask image before subtracting the S⁻ mask image from the SSFP image. When reconstructing the image, it is preferred to generate a maximum intensity projection image for best visualization of the venous structure. The invention is particularly useful in MR angiography where the desired FOV includes an area having a set of small vessels to screen for venous vascular disease, such as deep venous thrombosis which has been particularly difficult to diagnose in the calf area of a patient. The speed of the image acquisition also enables the screening of deep venous thrombus above the knee through the superficial femoral veins, iliac veins, inferior vena cava, right ventricle and pulmonary arteries. The extension of thrombus into the pulmonary arteries, a.k.a. pulmonary embolism, is the clinical complication of concern for deep venous thrombus as it can be life threatening. Another application is for acquisition of a high spatial resolution image subsequent to the conventional MRA acquisition 72 and 76 of FIG. 3. If the original screen draws attention to a region of possible arterial stenosis, the delayed acquisition can be performed with higher spatial resolution using the above fore-mentioned technique. The degree of stenosis can be better assessed from the high spatial resolution images to improve on the specificity of diagnosis. This technique could complement conventional contrast-enhanced MRA as an adjunct for example to increase diagnostic confidence in the detection of potential lesions (i.e. stenosis or intimal pathology) or to serve as an additional option following a non-diagnostic or failed contrast-enhanced MRA that occurs in approximately 10% in clinical cases.

As previously indicated, the acquisition of the S⁻ mask image can be acquired either before or after the acquisition of the SSFP image and is not dependent on the time elapsed from the injection of the contrast bolus. The technique can also include acquiring a second S⁻ mask image of the desired FOV, and then selecting which of the two, or more, S⁻ mask images minimizes mis-registration artifacts best, and then subtracting the selected S⁻ mask image from the SSFP image.

The present invention can be used with a first pass MRA to create a new hybrid approach. That is, the aforementioned technique can include acquiring an arterial-only mask image before injecting the contrast bolus, and then acquiring an arterial image a desired time after injecting the contrast bolus during a first pass of the contrast bolus but before acquiring the SSFP and the S⁻ mask images. The arterial-only mask image can then be subtracted from the arterial image to create an MR image of only the arterial structure.

This technique can be implemented with an MRI such as that described with reference to FIG. 1. The computer of that system is then programmed to acquire an SSFP image and an S⁻ SSFP image, one after the other, and in either order. The computer is programmed to subtract the S⁻ image from the SSFP image and then reconstruct an image with high contrast from the subtracted images. The computer is also programmed to acquire the S⁻ and SSFP images with minimal time separation therebetween to reduce mis-registration artifacts. The computer can optionally be programmed to apply the scaling factor, or allow operator intervention to allow trial and error of various scaling factors.

The invention is also embodied in a computer program that causes the computer to apply the SSFP pulse sequence and acquire an SSFP image, and apply an S⁻ pulse sequence and acquire an S⁻ SSFP image. The program then causes the computer to subtract the images and reconstruct an image with high background suppression and significant contrast between blood vessels and other soft tissue, such as fat, muscle, and bone marrow. One skilled in the art will readily recognize that the computer program can also perform the other steps and/or acts previously described.

The present invention has been described in terms of the preferred embodiment, and it is recognized that equivalents, alternatives, and modifications, aside from those expressly stated, are possible and within the scope of the appending claims.

What is claimed is:

1. An MR imaging technique comprising:
   injecting a contrast bolus into a subject;
   applying a pulse sequence with refocusing $S^-$ signals from a train of RF pulses to a desired FOV in the patient;
   acquiring an $S^-$ SSFP mask image of the desired FOV;
   acquiring an SSFP image of the desired FOV; and
   subtracting the $S^-$ SSFP mask image from the SSFP image.

2. The technique of claim 1 further comprising applying a scale factor to the $S^-$ SSFP mask image before subtracting the $S^-$ SSFP mask image from the SSFP image.

3. The technique of claim 1 wherein the acquisition of the $S^-$ SSFP mask image is not time dependent on the injection of the contrast bolus.

4. The technique of claim 1 further comprising:
   acquiring a second $S^-$ SSFP mask image of the desired FOV;
   selecting one of the first and second $S^-$ SSFP mask images to minimize mis-registration artifacts; and
   subtracting the selected $S^-$ SSFP mask image from the SSFP image.

5. The technique of claim 4 further comprising selecting a weighting for the selected $S^-$ SSFP mask image and applying the weighting to the selected $S^-$ SSFP mask image before the act of subtracting.

6. The technique of claim 1 wherein the acquisition of the $S^-$ SSFP mask image is acquired either before or after the acquisition of the SSFP image and is not dependent on time elapsed from the injection of the contrast bolus.

7. The technique of claim 1 further comprising:
   acquiring a pre-contrast mask image for arterial-only image generation before injecting the contrast bolus;
   acquiring an arterial image a desired time after injecting the contrast bolus and before acquiring the SSFP and the $S^-$ SSFP mask images; and
   subtracting the pre-contrast mask image from the arterial image.

8. The technique of claim 1 for use in MR angiography and further including screening the patient for arterial and venous vascular disease.

9. The technique of claim 8 as used in MR angiography and wherein the desired FOV includes an area having a set of small vessels in a calf of the patient and further includes diagnosing a presence or absence of deep venous thrombosis.

10. The method of claim 8 as used in MR angiography and wherein the desired FOV includes an area having a region of the arterial vasculature and further comprises diagnosing for one of a suspected lesion and vessel obstruction.

11. The method of claim 8 as used in MR angiography and wherein the desired FOV includes an area having a region of the arterial vasculature and further comprises diagnosing for deep venous thrombosis and potential pulmonary embolisms.

12. The technique of claim 1 further comprising generating maximum intensity projection (MIP) image according to:

$$MIP = SSFP \; \alpha \; (S^- \; SSFP)$$

where $\alpha$ is a weighting factor, SSFP is the SSFP image and $S^-$ SSFP is the $S^-$ SSFP mask image.

13. An MRI apparatus to acquire MRA images comprising:
   a magnetic resonance imaging (MRI) system having a plurality of gradient coils positioned about the bore of a magnet to impress a polarizing magnet field and an RF transceiver system and an RF switch controlled by a pulse module to transmit RF signals to an RF coil assembly to acquire MR images; and
   a computer programmed to:
      acquire an SSFP image and an $S^-$ SSFP image, one after another and in either order;
      subtract the $S^-$ SSFP image from the SSFP image; and
      reconstruct an image with high contrast from the subtracted images.

14. The MRI apparatus of claim 13 wherein the computer is programmed to acquire the $S^-$ SSFP and SSFP images with minimal time separation therebetween.

15. The MRI apparatus of claim 13 wherein the computer is further programmed to apply a pulse sequence with refocusing $S^-$ signals in order to acquire the $S^-$ SSFP image.

16. The MRI apparatus of claim 13 wherein the computer is further programmed to reconstruct a MIP image showing a 3-D image of vessels within a FOV.

17. The MRI apparatus of claim 16 as used in MR angiography and wherein the desired FOV includes an area having a set of small vessels in a calf of the patient and further includes diagnosing a presence or absence of deep venous thrombosis.

18. The MRI apparatus of claim 16 as used in MR angiography and wherein the desired FOV includes an area having a region of the arterial vasculature suspected as having at least one of a lesion and a vessel obstruction.

19. The MRI apparatus of claim 13 wherein the computer is further programmed to apply a scaling factor to the $S^-$ SSFP image before the subtraction.

20. The MRI apparatus of claim 19 wherein the computer is further programmed to allow user input to adjust the scaling factor for improved background suppression and highest contrast.

21. The MRI apparatus of claim 13 wherein the computer is further programmed to acquire a second $S^-$ SSFP image and allow selection of a $S^-$ SSFP image that minimizes mis-registration artifacts.

22. The MRI apparatus of claim 13 wherein the computer is further programmed to:
   acquire a pre-contrast mask image for arterial-only image generation;
   receive a contrast input indicative of a contrast bolus injection into a patient;
   acquire an arterial image within a specified time of receipt of the contrast input; and
   reconstruct an arterial-only contrast image.

23. A computer program for use with an MRI scanner having a computer programmed by the computer to:
   apply an SSFP pulse sequence and acquire an SSFP data set;
   apply an $S^-$ SSFP pulse sequence and acquire an $S^-$ SSFP data set;

subtract the SSFP data set and the S⁻ SSFP data set; and reconstruct an image with high background supperession and significant contrast between blood vessels and soft tissue.

24. The computer program of claim 23 to further:

apply a weighting factor to the S⁻ SSFP data set; and reconstruct a MIP image to display a 3-D image of vessel structure.

25. The computer program of claim 23 to further:

acquire a second S⁻ SSFP image; and select a desired S⁻ SSFP image for use in the subtraction.

26. The computer program of claim 23 wherein the application of the SSFP pulse sequence occurs before the S⁻ SSFP pulse sequence.

27. The computer program of claim 23 wherein the application of both the S⁻ SSFP and SSFP pulse sequences are not timed to a contrast bolus injection.

28. The computer program of claim 23 wherein the SSFP and S⁻ SSFP images are acquired with minimal time separation to minimize motion artifacts.

29. The computer program of claim 23 wherein the S⁻ SSFP pulse sequence includes a refocusing RF signal.

30. The computer program of claim 23 to further:

acquire a pre-contrast mask image for arterial-only image generation;

receive a contrast input indicative of a contrast bolus injection into a patient;

acquire an arterial image within a specified time from the contrast input; and reconstruct an arterial-only contrast image.

31. The computer program of claim 23 for use with MR angiography wherein the reconstructed image includes data for screening for venous vascular disease.

32. The computer program of claim 23 for use in MR angiography and wherein the desired FOV includes an area having a region of the arterial vasculature suspected of having a lesion or vessel obstruction.

* * * * *

UNITED STATES PATENT AND TRADEMARK OFFICE
CERTIFICATE OF CORRECTION

PATENT NO. : 6,493,569 B2
DATED : December 10, 2002
INVENTOR(S) : Foo et al.

It is certified that error appears in the above-identified patent and that said Letters Patent is hereby corrected as shown below:

Column 12,
Line 5, delete "MIP = SSFP α (S¯ SSFP)" and substitute therefore
-- MIP = SSFP - α (S¯ SSFP) --

Signed and Sealed this

Fourth Day of March, 2003

JAMES E. ROGAN
*Director of the United States Patent and Trademark Office*